(12) United States Patent
Lewis et al.

(10) Patent No.: US 8,896,344 B1
(45) Date of Patent: Nov. 25, 2014

(54) HETEROGENEOUS PROGRAMMABLE DEVICE AND CONFIGURATION SOFTWARE ADAPTED THEREFOR

(71) Applicant: Altera Corporation, San Jose, CA (US)

(72) Inventors: David Lewis, Toronto (CA); Valavan Manohararajah, Scarborough (CA); David Galloway, Toronto (CA)

(73) Assignee: Altera Corporation, San Jose, CA (US)

( * ) Notice: Subject to any disclaimer, the term of this patent is extended or adjusted under 35 U.S.C. 154(b) by 39 days.

(21) Appl. No.: 13/733,985

(22) Filed: Jan. 4, 2013

(51) Int. Cl.
*H03K 19/173* (2006.01)
*G06F 17/50* (2006.01)
*H03K 19/177* (2006.01)

(52) U.S. Cl.
CPC .......... *H03K 19/177* (2013.01); *G06F 17/5054* (2013.01); *G06F 17/505* (2013.01)
USPC ............................ 326/38; 716/101; 716/116

(58) Field of Classification Search
CPC ................ H03K 19/17763; H03K 19/17728; H03K 19/1776; H03K 19/1733; G06F 17/5045; G06F 17/505; G06F 17/5054; G06F 17/5072
USPC ............ 326/47, 101; 716/101, 116, 117, 121, 716/128, 126
See application file for complete search history.

(56) References Cited

U.S. PATENT DOCUMENTS

| | | | |
|---|---|---|---|
| 5,663,888 A | 9/1997 | Chakradhar | |
| 6,263,483 B1 * | 7/2001 | Dupenloup | 716/104 |
| 6,378,123 B1 * | 4/2002 | Dupenloup | 716/104 |
| 6,466,898 B1 | 10/2002 | Chan | |
| 7,299,458 B2 | 11/2007 | Hammes | |
| 7,405,589 B2 * | 7/2008 | Lewis et al. | 326/38 |
| 7,594,195 B2 | 9/2009 | Jain et al. | |
| 7,926,016 B1 | 4/2011 | Sundararajan et al. | |
| 8,286,137 B2 | 10/2012 | Kahlon et al. | |
| 8,296,696 B1 | 10/2012 | Chiu et al. | |
| 8,402,408 B1 | 3/2013 | van Antwerpen et al. | |
| 8,677,298 B1 * | 3/2014 | Manohararajah et al. | 716/116 |
| 2002/0162097 A1 | 10/2002 | Meribout | |
| 2004/0068711 A1 | 4/2004 | Gupta et al. | |
| 2008/0276209 A1 | 11/2008 | Albrecht et al. | |
| 2009/0146686 A1 | 6/2009 | Voogel et al. | |
| 2010/0058261 A1 | 3/2010 | Markov et al. | |

(Continued)

OTHER PUBLICATIONS

Betz, V., et al., *Architecture and CAD for Deep-Submicron FPGAs*, Kluwer Academic Publishers, Feb. 1999.

(Continued)

*Primary Examiner* — Dylan White
(74) *Attorney, Agent, or Firm* — Ropes & Gray LLP; Jeffrey H. Ingerman

(57) ABSTRACT

A method of configuring a programmable integrated circuit device with a user logic design includes analyzing the user logic design to identify unidirectional logic paths within the user logic design and cyclic logic paths within the user logic design, assigning the cyclic logic paths to logic in a first portion of the programmable integrated circuit device that operates at a first data rate, assigning the unidirectional logic paths to logic in a second portion of the programmable integrated circuit device that operates at a second data rate lower than the first data rate, and pipelining the unidirectional data paths in the second portion of the programmable integrated circuit device to compensate for the lower second data rate. A programmable integrated circuit device adapted to carry out such method may have logic regions operating at different rates, including logic regions with programmably selectable data rates.

22 Claims, 5 Drawing Sheets

(56) References Cited

U.S. PATENT DOCUMENTS

| | | | |
|---|---|---|---|
| 2010/0134141 A1* | 6/2010 | Bertin et al. | 326/39 |
| 2011/0227606 A1* | 9/2011 | Wang et al. | 326/82 |
| 2012/0227026 A1* | 9/2012 | Goldman et al. | 716/128 |

OTHER PUBLICATIONS

Carloni, L.P., et al., "A Methodology for Correct-by-Construction Latency Insensitive Design", *ICCAD '99: Proceedings of the 1999 IEEE/ACM International Conference on Computer-aided Design*, pp. 309-315, 1999.

Cong, J., et al., "Physical Planning with Retiming", *ICCAD-2000: Proceedings of the 2000 IEEE/ACM International Conference on Computer-aided Design*, pp. 2-7, 2000.

Cormen, T.H., et al., *Introduction to Algorithms*, MIT Press and McGraw Hill, Third Edition, pp. 651-655, 2009.

Dasdan, A., "Experimental Analysis of the Fastest Optimum Cycle Ratio and Mean Algorithms", *ACM Transactions on Design Automation of Electronic Systems*, vol. 9, No. 4, pp. 385-418, Oct. 2004.

Deokar, R.B., et al., "A Fresh Look at Retiming via Clock Skew Optimization", *DAC '95: Proceedings of the 32nd Annual ACM/IEEE Design Automation Conference*, pp. 310-315, 1995.

Hurst, A.P., et al., "Physical Placement Driven by Sequential Timing Analysis", *ICCAD-2004: Proceedings of the 2004 IEEE/ACM International Conference on Computer-aided Design*, pp. 379-386, 2004.

Leiserson, C.E., et al., "Retiming Synchronous Circuitry", Digital Equipment Corporation, Aug. 20, 1986, published in *Algorithmica*, vol. 6, No. 1, pp. 5-35, Jun. 1991.

Maheshwari, N., et al., *Timing Analysis and Optimization of Sequential Circuits*, Springer, pp. 9, 14-17, 1998.

Manohararajah, V., et al., "Heuristics for Area Minimization in LUT-Based FPGA Technology Mapping", *IEEE Transactions on CAD*, vol. 25, No. 11, pp. 2331-2340, Nov. 2006.

Singh, D.P., et al., Integrated Retiming and Placement for Field Programmable Gate Arrays, *FPGA '02: ACM International Symposium on Field Programmable Gate Arrays*, pp. 67-76, Feb. 2002.

Weaver, N., et al., "Post-Placement C-Slow Retiming for the Xilinx Virtex FPGA", *FPGA '03: ACM International Symposium on Field Programmable Gate Arrays*, pp. 185-194, Feb. 2003.

Weaver, N., et al., "The Effects of Datapath Placement and C-Slow Retiming on Three Computational Benchmarks", *FCCM '02: The 10th Annual IEEE Symposium on Field-Programmable Custom Computing Machines*, pp. 303-306, Feb. 2003.

Eguro, K., "Supporting High-Performance Pipelined Computation in Commodity-Style FPGAs", University of Washington doctoral dissertation, pp. 1-168 (2008).

Li, S., et al., "QuickRoute: A Fast Routing Algorithm for Pipelined Architectures", *2004 IEEE International Conference on Field-Programmable Technology* pp. 73-80 (2004).

Sharma, A., et al., "PipeRoute: A Pipelining-Aware Router for FPGAs", *FPGA '03: Proceedings of the 2003 ACM/SIGDA eleventh international symposium on Field programmable gate arrays*, pp. 68-77 (Feb. 23-25, 2003).

Singh, D., et al., "The Case for Registered Routing Switches in Field Programmable Gate Arrays", *FPGA '01: Proceedings of the 2001 ACM/SIGDA ninth international symposium on Field programmable gate arrays*, pp. 161-169 (Feb. 11-13, 2001).

Tsu, W., et al., "HSRA: High-Speed, Hierarchical Synchronous Reconfigurable Array", *FPGA '99: Proceedings of the 1999 ACM/SIGDA seventh international symposium on Field programmable gate arrays*, pp. 125-134 (1999).

\* cited by examiner

HETEROGENEOUS PROGRAMMABLE DEVICE AND CONFIGURATION SOFTWARE ADAPTED THEREFOR

FIELD OF THE INVENTION

This invention relates to heterogeneous programmable integrated circuit devices such as field-programmable gate array (FPGAs) or other types of programmable logic devices (PLDs), and to configuration software adapted for configuring such heterogeneous devices.

BACKGROUND OF THE INVENTION

Early programmable devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

While it may have been possible to configure the earliest programmable logic devices manually, simply by determining mentally where various elements should be laid out, it was common even in connection with such earlier devices to provide programming software that allowed a user to lay out logic as desired and then translate that logic into a configuration for the programmable device. With current larger devices, it would be impractical to attempt to lay out the logic without such software.

Some user logic designs would be able to operate at higher clock speeds if the designs could be pipelined. However, certain user logic designs may include portions that are amenable to pipelining as well as portions that are not amenable to pipelining. Configuration software has not heretofore been well-adapted to deal with pipelining in such types of user logic designs.

SUMMARY OF THE INVENTION

Unidirectional or "feed-forward" logic paths are amenable to pipelining. On the other hand, cyclic logic paths (i.e., loops) are less amenable to pipelining. If a user logic design includes both feed-forward and cyclic logic paths, and only the feed-forward logic can be pipelined, then a way to speed up the cyclic logic paths, so that they can operate at the same clock speed as the pipelined feed-forward logic paths, should be provided. Otherwise, the cyclic logic paths will fall behind the pipelined feed-forward logic paths, and then execution of the feed-forward logic paths will have to stop and wait for the cyclic logic paths, defeating the purpose of pipelining the feed-forward logic paths.

One way to accomplish such a result is to provide a programmable device in which most of the programmable logic resources are in a first group operable up to a first data rate, with a smaller amount of programmable logic resources being in a second group operable up to a second data rate faster than the first data rate. The feed-forward logic paths which can be pipelined may be implemented in the slower programmable logic resources in the first group, while the cyclic logic paths that cannot be pipelined may be implemented in the faster programmable logic resources in the second group.

When configuring such a device according to a user logic design, the configuration software would have to be able to distinguish the cyclic paths from the feed-forward paths, so that it can implement the cyclic paths in the faster programmable logic resources and implement the feed-forward paths, with pipelining, in the slower programmable logic resources.

Therefore, in accordance with the present invention there is provided a method of configuring a programmable integrated circuit device with a user logic design. The method includes analyzing the user logic design to identify unidirectional logic paths within the user logic design and cyclic logic paths within the user logic design, assigning the cyclic logic paths to logic in a first portion of the programmable integrated circuit device that operates at a first data rate, and assigning the unidirectional logic paths to logic in a second portion of the programmable integrated circuit device that operates at a second data rate lower than the first data rate, and pipelining the unidirectional data paths in the second portion of the programmable integrated circuit device to compensate for the lower second data rate.

A machine-readable data storage medium encoded with instructions for carrying out such a method also is provided, as is a programmable integrated circuit device adapted to carry out such method.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Figure 1:
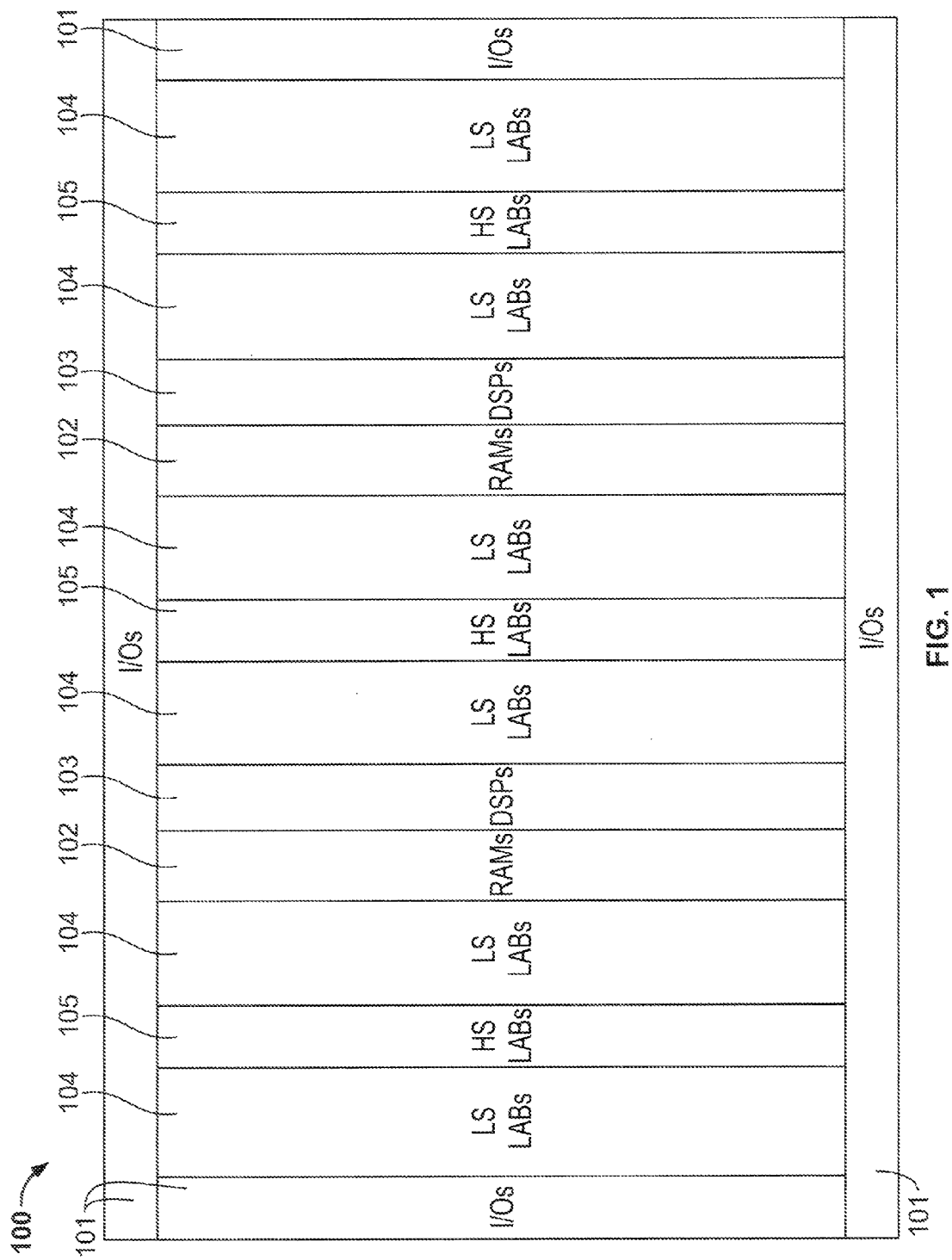
FIG. 1 shows an overview of the floor plan of one example of a heterogeneous programmable integrated circuit device 100 useful in embodiments of the present invention.

FIG. 1 shows an overview of the floor plan of one example of a heterogeneous programmable integrated circuit device 100 useful in embodiments of the present invention. Device 100 is a field-programmable gate array (FPGA), but other types of programmable logic devices (PLDs) or other programmable integrated circuit devices may be used in embodiments of the invention.

In addition to input/output regions 101, optional memory (RAM) regions 102 and optional digital signal processing (DSP) regions 103, one or more regions 104 of device 100 may contain lower (or "normal") speed programmable logic resources. These resources are designated in the drawing as "LS LABs," or low-speed logic array blocks, referring to a unit of programmable logic resources in devices provided by Altera Corporation, of San Jose, Calif. However, the invention is applicable to programmable devices from any source. In addition to low-speed resources 104, device 100 also contains high-speed resources in regions 105, designated in the drawing as "HS LABs," or high-speed logic array blocks.

As depicted schematically in FIG. 1, there is less area devoted to high-speed resources 105 than there is area devoted to low-speed resources 104. That is because high-speed resources 105 are more expensive than low-speed resources 104. For example, high-speed resources 105 may be implemented using wider transistor widths, lower threshold voltages, shorter gate lengths, higher drive voltages, wider wire widths, or other circuit techniques that consume more device overhead per unit of logic.

For example, providing a threshold voltage 30 mV lower than nominal may provide 20% higher speed (1.2 times $f_{max}$ or 0.8333 times the delay) than a nominal device speed, at a cost of doubling the static power consumption.

Alternatively, using a drive voltage 20% higher than nominal in the high-speed resources 104 may provide 20% higher speed at 50% total (static+dynamic) power consumption. At the same time, a drive voltage 20% lower than nominal in the low-speed resources 105 may provide 20% lower speed (0.8 times $f_{max}$=1.25 times the delay) at 50% lower static power or 40% lower total power. Thus the total device power consumption is comparable to nominal power consumption, but high-speed resources 104 offer 20% higher than nominal speed.

Assuming that 30% of the programmable resources are high-speed resources 104 and 70% of the programmable resources are low-speed resources 105, then using threshold voltage to increase speed results in a static power adjustment factor of 0.3×2+0.7×0.6=1.02, while using the drive voltage to increase speed results in a static power adjustment factor of 0.3×1.5+0.7×0.6=0.87. Thus it is expected that the performance gain may be achieved at a power increase as low as 2%, or even a decrease in power of at least 13%.

As noted above, decisions on which regions to assign to particular portions of a user logic design can be based on whether or not those portions can be pipelined. One factor which may indicate whether a particular portion of logic can be pipelined is whether that particular portion of logic is cyclic or not. Unidirectional or feed-forward logic can be assigned low-speed logic regions 105 with little impact on speed because the logic can be pipelined to a depth needed to compensate. Cyclic logic can be assigned to high-speed regions 105, so that the overall logic design operates at a desired speed.

For example, considering a user logic design that can be pipelined to 1000 MHz—e.g., using a pipelined FPGA such as that described in copending, commonly-assigned U.S. patent application Ser. No. 13/630,925, with a depth of five registers, or 5 ns latency in the unidirectional logic. In embodiments of the present invention, the cyclic logic, which cannot be pipelined, can be placed in a high-speed region 104 and run at, e.g., 1200 MHz. However the unidirectional logic will now exhibit latency of 5×1.2=6 ns, because the low speed logic will now have a clock period of 1.2 ns instead of the original 1 ns, but will need to run at 1200 MHz to match the clock rate of the cyclic logic. Therefore, the unidirectional logic would need to be pipelined to a depth of 6 ns×1200 MHz=7.2 stages, so at least eight pipeline stages will be required to meet this speed. In a pipelined FPGA fabric, with sufficient registers available, this should not be difficult. Therefore the overall performance of the device can improved by 20% compared to a known device, at essentially no power cost as described above.

Figure 2:
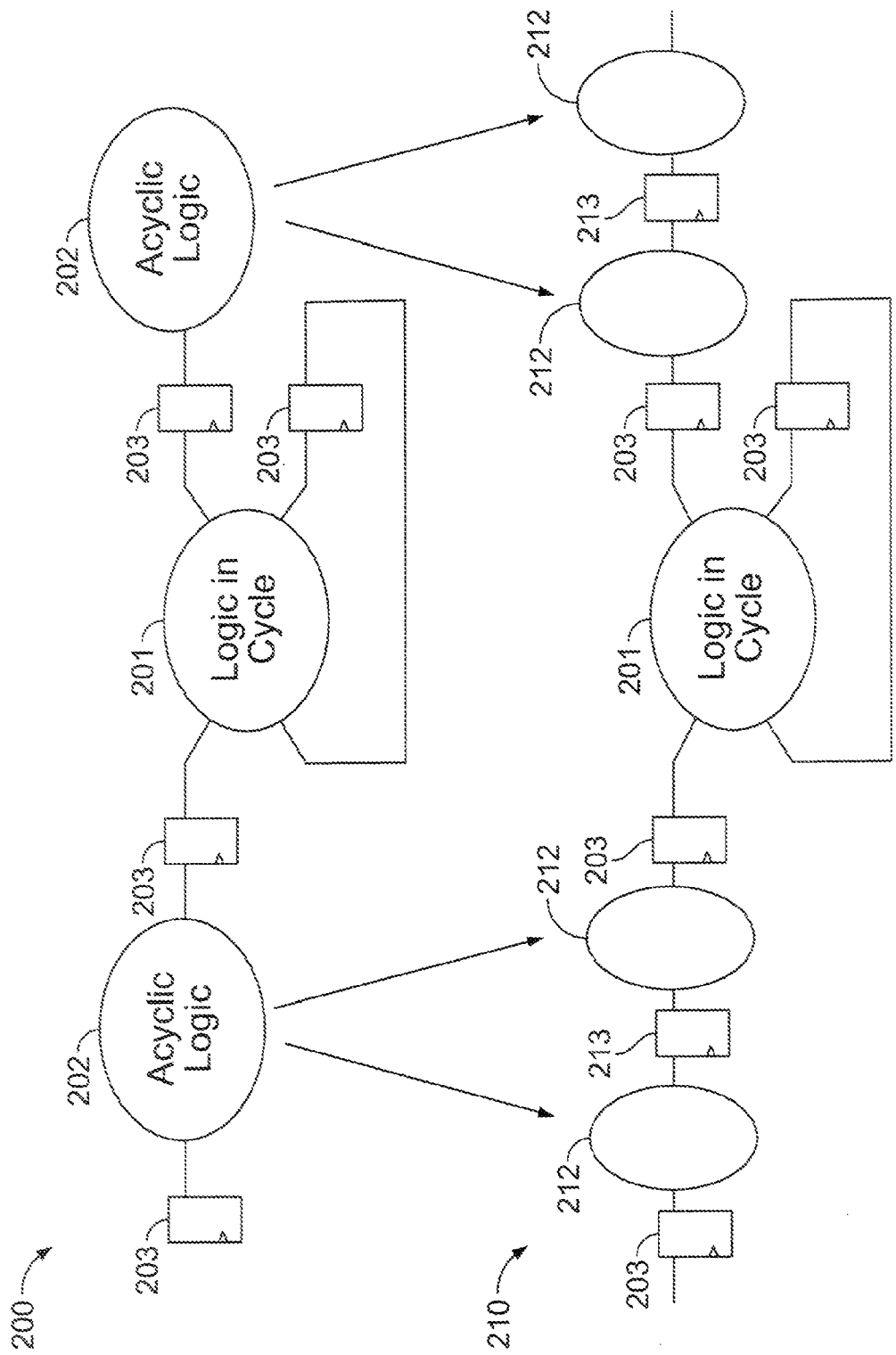
FIG. 2 shows an example of pipelining of a system including cyclic and acyclic logic.

For example, FIG. 2 shows an example of a system 200 containing cyclic logic 201 and acyclic (i.e., unidirectional) logic 202, including registers 203. Acyclic logic 202 in cycles may be decomposed into more pipeline stages 212, by adding additional registers 213, decreasing the depth of logic between each stage, and increasing its performance and latency of resulting system 210, but not changing its behavior in any other way.

According to other implementations, the differentiation between high-speed resources and low-speed resources could be made user-configurable. For example, that differentiation might be accomplished by body bias or by providing a programmable drive voltage for some or all of the programmable logic regions. In such a device, the number of high-speed regions can be configured based on the fraction of the design that is cyclic, which determines the number of regions needed to implement the cyclic logic. Based on that number and an allowable power budget, the drive voltages of the high-speed and low-speed logic regions can be selected to minimize total power while meeting desired performance goals.

In one example of such an implementation, the drive voltage in the low-speed region may be reduced as far as possible until one of two limits is met. A first limit is that at very low speed, the individual circuit elements may not be able to operate at the required $f_{max}$—i.e., at sufficiently low drive voltage, even a single routing wire may not be fast enough. A second limit is that as the drive voltage is lowered, the latency increases, and may reach an unacceptable value at some point.

In another implementation, the high-speed regions can include logic elements based on six-input lookup tables (6-LUTs), while the low-speed regions can include logic elements based on four-input lookup tables (4-LUTs).

A heterogeneous logic fabric of the type described may present challenges to the configuration software used to implement a user logic design. For example, a mix of different logic element types may create difficulty in matching the user logic design to the exact ratio of logic element types provided on the device. However, where the design includes a unidirectional portion that can be pipelined, because pipelining can be accomplished late in the configuration process (as described in more detail below), the heterogeneity of the device may be less of a challenge than might otherwise be expected.

For example, in an architecture as described above, the high-speed logic elements are based on 6-LUTs for performance, and the low-speed logic elements are based on 4-LUTs for low cost. The configuration software may synthesize the entire netlist of a user logic design into 6-LUTs—i.e., as a single high-speed region. Next, the cyclic logic portion of the user logic design are placed in that high-speed region. The unidirectional part of the user logic design may then be placed into the unused portion of the high-speed region, approximating a low-speed region by pretending that the 6-LUTs in the user logic design are actually 4-LUTs. Finally, all of the LUTs that are placed in the approximated low-speed region can be resynthesized into 4-LUTs and placed in the actual hardware.

It would be more efficient to synthesize the cyclic logic into high-speed logic elements and the unidirectional logic into low-speed logic elements in the first instance, but only if the amounts of each type of logic element are known in advance. Otherwise, attempting to synthesize different types of logic elements would be less efficient. Therefore, it is desirable to be able to determine in advance how much high-speed logic and how much low-speed logic will be required for a particular user logic design.

There are a number of different ways to determine how much high-speed logic and how much low-speed logic will be required. One approach would be to run a cycle detection algorithm on the user logic design. If one assumes that all cyclic logic paths will be placed in high-speed logic and all feed-forward logic would be placed in low-speed logic, then the relative amounts of high-speed logic and low-speed logic could be determined from the results of the cycle detection algorithm.

There are some well-known algorithms for cycle detection. For example, Tarjan, R. E., "Depth-first search and linear graph algorithms," *SIAM Journal of Computing* 1(2): 146-60 (1972) describes a strongly-connected-components algorithm that discovers all nodes that are within cycles. Use of such an algorithm would be acceptable when the amount of available high-speed resources is large relative to the amount of logic in the user logic design that is in cycles. However, in a situation in which the amount of available high-speed resources is insufficient to accommodate all of the logic that is in cycles, the assignment of logic to the high-speed resources preferably should be more intelligent.

For example, if the target period is 1ns, a loop that has a total delay of 5 ns and ten registers in it is not likely to be critical because it could potentially be retimed by repositioning registers to obtain a 5 ns/10=500 ps period. However, a loop that has a total delay of 5 ns and five registers in it is likely to be critical. Thus, it would be better to be able to determine the estimated delay of each loop, and the number of registers in each loop, to determine the nodes that are most likely to benefit from being assigned to the high-speed logic resources, rather than simply basing the assignment on whether or not the node is in a loop.

One alternative may be to determine critical and near-critical cycles, where a critical cycle is one whose delay cannot be increased without increasing the period achievable by retiming, and a near-critical cycle is one whose delay can be increased slightly before it increases the period achievable by retiming. Preferential treatment could then be given to nodes on critical and near-critical cycles during the assignment of nodes as between high-speed logic resources and low-speed logic resources. One way to make such a determination is to use the timing analysis techniques described in commonly-assigned, concurrently-filed U.S. patent application Ser. No. 13/733,982, now U.S. Pat. No. 8,677,298.

Another alternative uses timing analysis techniques also described in the above-identified application Ser. No. 13/733,982, now U.S. Pat. No. 8,677,298, to analyze the timing of a user logic design under the assumption that registers will be moved to minimize the clock period. Given an estimate of the delays on each circuit element, that timing analysis produces a "cycle slack" value and a "cycle slack ratio" value for each circuit element. Cycle slack indicates how much delay can be added to the circuit element before it impacts the optimal clock period. Cycle slack ratio is a normalization of the slack ratio, resulting in a number between 0 and 1. As the cycle slack ratio for an element gets closer to 0, that element is considered more critical, while as the cycle slack ratio for an element gets closer to 1, that element is considered less critical. Preferential treatment may be given to those nodes with less cycle slack or with cycle slack ratios closer to 0 when determining which portion of the user logic design to implement in high-speed logic resources.

Where the hardware, as described above, uses regions of different technologies for the high-speed and low-speed resources (e.g., larger and smaller LUTs as described), the configuration software can be designed so that the technology mapping step maps logic elements into a heterogeneous mixture of LUTs according to their criticality, as determined, e.g., by cycle slack or cycle slack ratio. Many known technology mapping techniques use an iterative flow, such as that described in Manohararajah, V., et al., "Heuristics for Area Minimization in LUT-Based FPGA Technology Mapping," *IEEE Transactions on CAD*, vol. 25, no. 11, pp. 2331-40 (November 2006), which during a current pass uses information from previous passes to bias the current pass. Technology mapping algorithms are also capable of using cycle slack and cycle slack ratios, provided by timing analysis, to bias the selection of larger LUTs for those nodes with low cycle slack or low cycle slack ratios.

Those two features of mapping algorithms can be used together to map a user logic design into a fabric of heterogeneous logic resources. For example, on a first pass, the cost function of the larger LUTs in the high-speed region can be made low so that the mapping algorithm puts a large portion of the user logic design into the high-speed region. However, if the actual high-speed resources are overused, or the resulting ratio of the high-speed resources to low-speed resources does not mimic what is present in the actual device, the cost function of the larger LUTs can be gradually increased in subsequent iterations—which would have the effect of reassigning less critical nodes to the low-speed resources—until an appropriate distribution of logic between the high-speed resources and the low-speed resources is achieved.

The distribution of logic between the high-speed resources and the low-speed resources by technology mapping will frequently result in an acceptable solution. However, there may be situations when the subsequent clustering step may find inaccuracies in the actual amounts of high-speed and low-speed resources required. In such situations, some of the logic mapped into high-speed resources could be resynthesized into low-speed resources. As in the original technology mapping, the logic that would be selected for resynthesis from high-speed resources to low-speed resources would be that logic, among the logic originally synthesized in high-speed resources, with the highest cycle slack or cycle slack ratio as reported by timing analysis.

Figure 3:
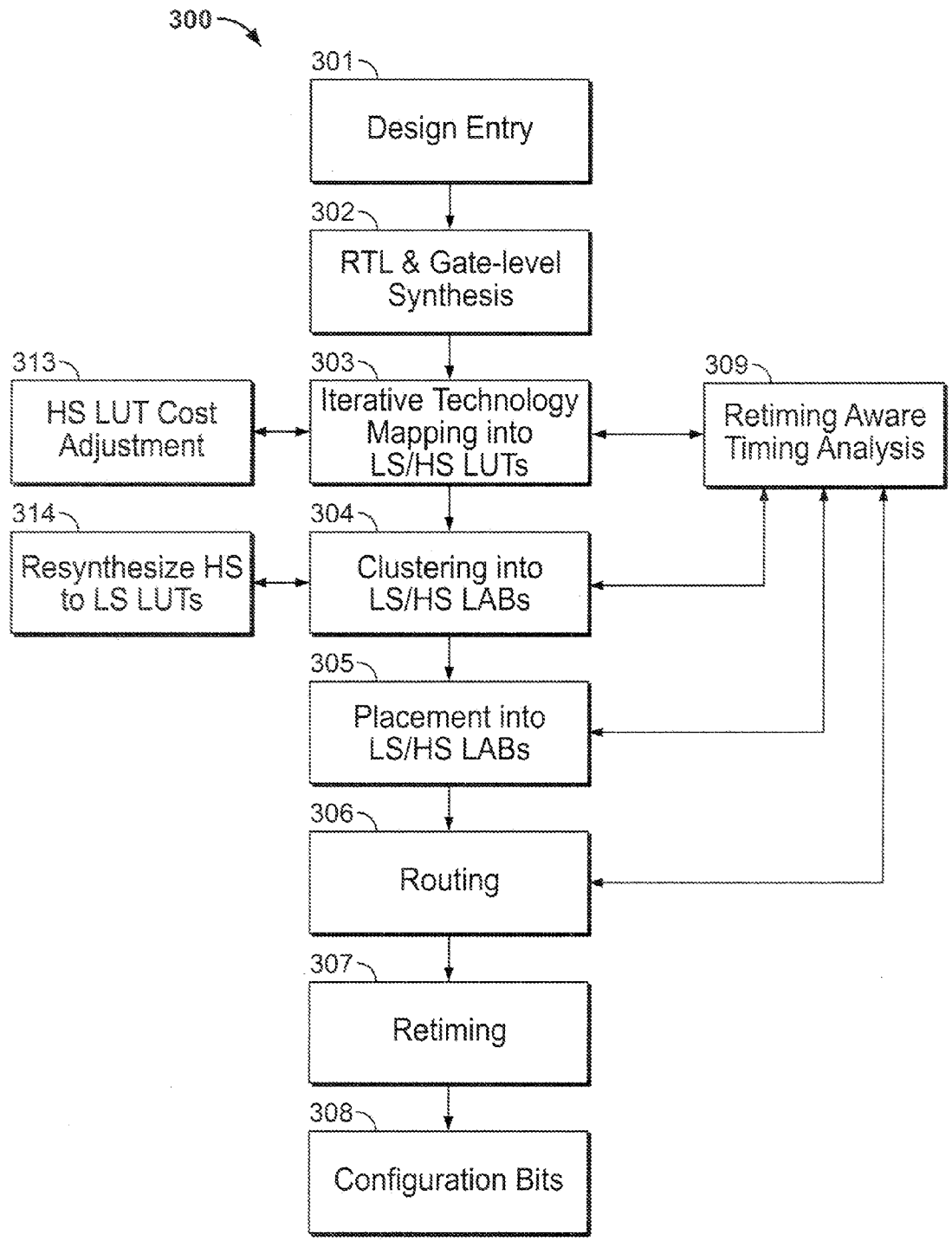
FIG. 3 is a flow diagram of an example of a programmable device configuration method according to embodiments of the invention.

FIG. 3 shows an example of a programmable device configuration method 300, which may be implemented in software, according to embodiments of the invention. Method 300 starts at 301 and proceeds to RTL and gate-level synthesis at 302, which may be conventional. Method 300 ends at 308 with the outputting of a configuration bitstream for a programmable device such as an FPGA. Outputting 308 is preceded at 307 by retiming, which, as is conventional, redistributes registers to reduce latency and maximize operating frequency $f_{max}$. Each of the intervening portions 303-306 is carried out based on a timing analysis 309 that takes into account that retiming 307 ultimately will be carried out.

Iterative technology mapping is carried out at 303 in the manner described above. As noted, an initial distribution between high-speed resources and low-speed resources is made based on timing analysis 309. That distribution is compared to the actual distribution of high-speed resources and low-speed resources available on the physical device, adjusting the relative cost of high-speed resources and low-speed resources at 313 to make high-speed resources relatively more costly on each iteration.

Next, the mapped logic elements are clustered at 304 into blocks. During clustering, it may be determined, as noted above, that the ratio of high-speed resources to low-speed resources does not correspond to the actual distribution of resources on the device to be configured, and in particular that more logic has been mapped to high-speed resources than there are available high-speed resources on the device. If so, then as described above, some of the logic that had been mapped to high-speed resources will be resynthesized at 314 to low-speed resources.

Retiming-aware placement and routing take place at 305 and 306, respectively, followed by the aforementioned retiming 307. Method 300 ends with the outputting at 308 of a configuration bitstream for device 100.

Thus it is seen that a programmable device in which most of the programmable logic resources are in a first group operable up to a first data rate, with a smaller amount of programmable logic resources being in a second group operable up to a second data rate faster than the first data rate, in which feed-forward logic paths which can be pipelined may be implemented in the slower programmable logic resources in the first group, while cyclic logic paths that cannot be pipelined may be implemented in the faster programmable logic resources in the second group, has been provided, along with a method of programming or configuring such a device.

Instructions for carrying out a method according to this invention for programming a programmable device may be encoded on a machine-readable medium, to be executed by a suitable computer or similar device to implement the method of the invention for programming or configuring PLDs or other programmable devices. For example, a personal computer may be equipped with an interface to which a PLD can be connected, and the personal computer can be used by a user to program the PLD using suitable software tools as described above.

Figure 4:
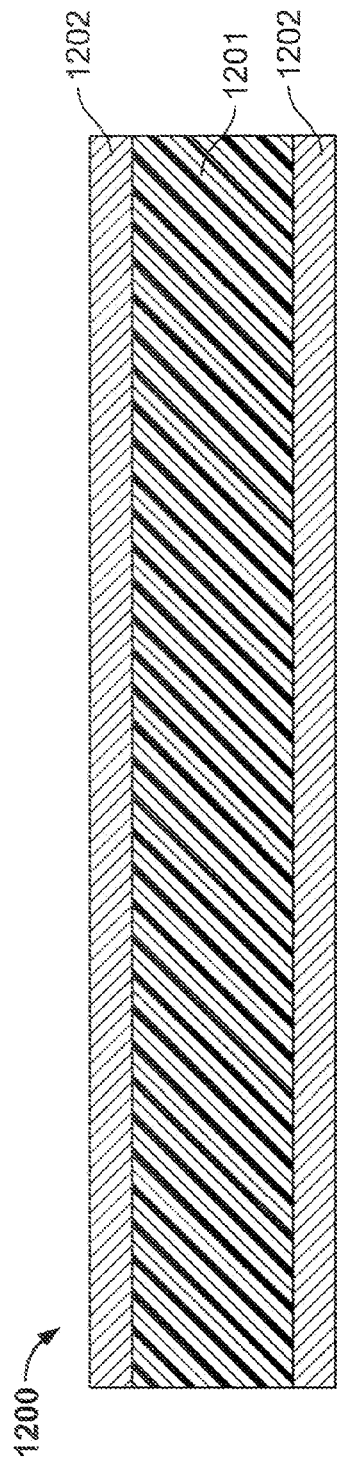
FIG. 4 is a cross-sectional view of a magnetic data storage medium encoded with a set of machine-executable instructions for performing the method according to the present invention.

FIG. 4 presents a cross section of a magnetic data storage medium 1200 which can be encoded with a machine executable program that can be carried out by systems such as the aforementioned personal computer, or other computer or similar device. Medium 1200 can be a floppy diskette or hard disk, or magnetic tape, having a suitable substrate 1201, which may be conventional, and a suitable coating 1202, which may be conventional, on one or both sides, containing magnetic domains (not visible) whose polarity or orientation can be altered magnetically. Except in the case where it is magnetic tape, medium 1200 may also have an opening (not shown) for receiving the spindle of a disk drive or other data storage device.

The magnetic domains of coating 1202 of medium 1200 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 5:
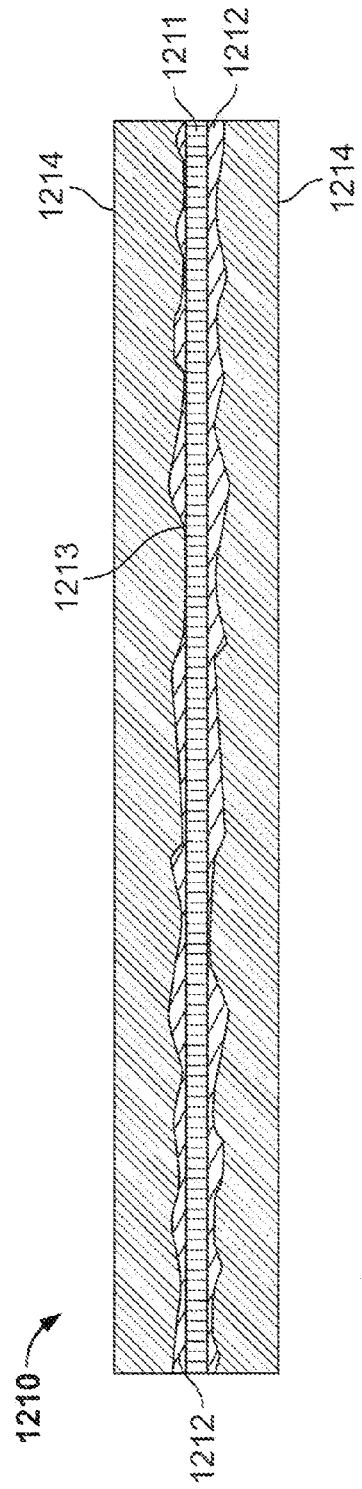
FIG. 5 is a cross-sectional view of an optically readable data storage medium encoded with a set of machine executable instructions for performing the method according to the present invention.

FIG. 5 shows a cross section of an optically-readable data storage medium 1210 which also can be encoded with such a machine-executable program, which can be carried out by systems such as the aforementioned personal computer, or other computer or similar device. Medium 1210 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1210 preferably has a suitable substrate 1211, which may be conventional, and a suitable coating 1212, which may be conventional, usually on one or both sides of substrate 1211.

In the case of a CD-based or DVD-based medium, as is well known, coating 1212 is reflective and is impressed with a plurality of pits 1213, arranged on one or more layers, to encode the machine-executable program. The arrangement of pits is read by reflecting laser light off the surface of coating 1212. A protective coating 1214, which preferably is substantially transparent, is provided on top of coating 1212.

In the case of magneto-optical disk, as is well known, coating 1212 has no pits 1213, but has a plurality of magnetic domains whose polarity or orientation can be changed magnetically when heated above a certain temperature, as by a laser (not shown). The orientation of the domains can be read by measuring the polarization of laser light reflected from coating 1212. The arrangement of the domains encodes the program as described above.

Figure 6:
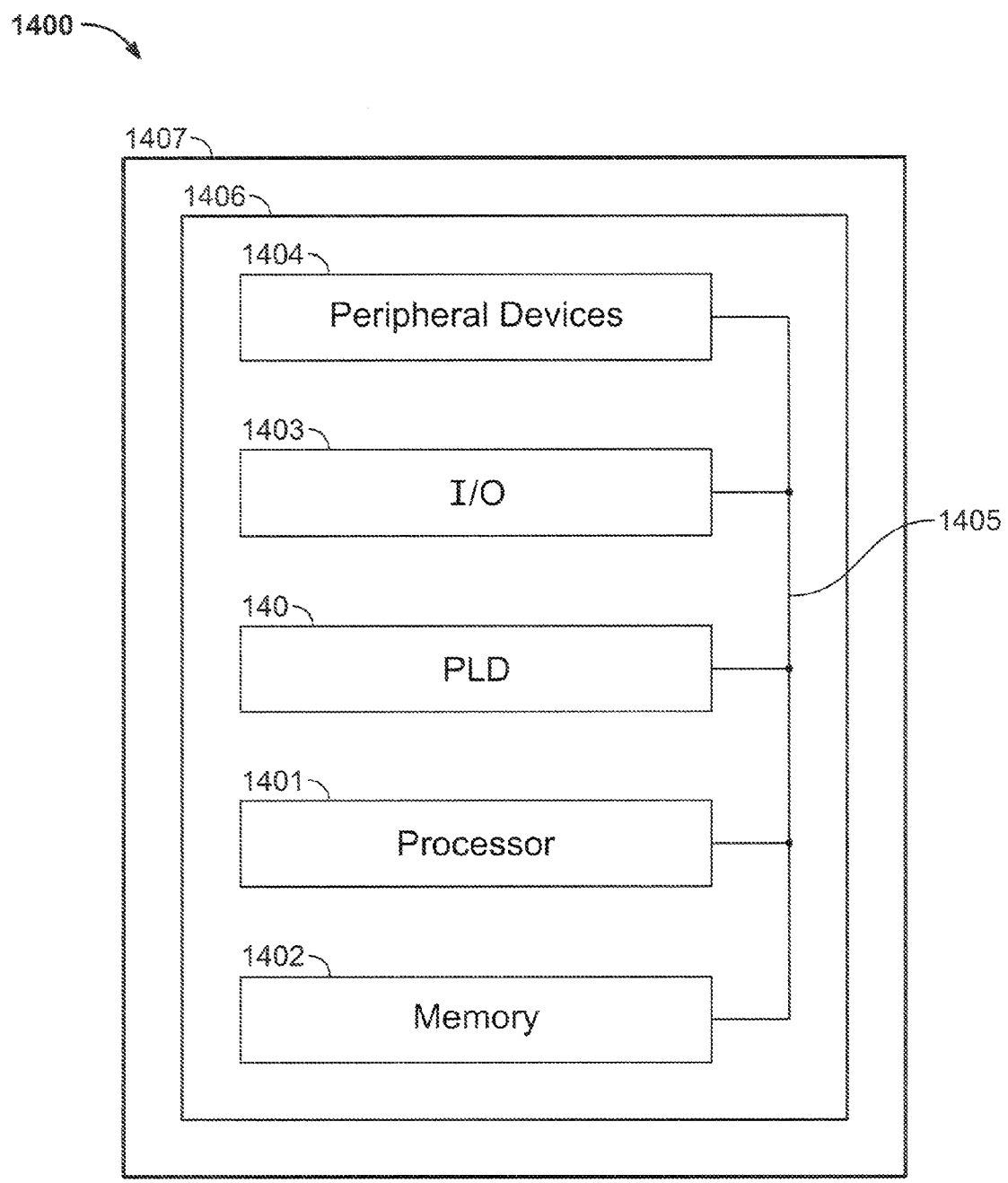
FIG. 6 is a simplified block diagram of an illustrative system employing a programmable logic device incorporating the present invention.

A PLD 140 programmed according to the present invention may be used in many kinds of electronic devices. One possible use is in a data processing system 1400 shown in FIG. 6. Data processing system 1400 may include one or more of the following components: a processor 1401; memory 1402; I/O circuitry 1403; and peripheral devices 1404. These components are coupled together by a system bus 1405 and are populated on a circuit board 1406 which is contained in an end-user system 1407.

System 1400 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 140 can be configured as a processor or controller that works in cooperation with processor 1401. PLD 140 may also be used as an arbiter for arbitrating access to a shared resources in system 1400. In yet another example, PLD 140 can be configured as an interface between processor 1401 and one of the other components in system 1400. It should be noted that system 1400 is only exemplary, and that the true scope and spirit of the invention should be indicated by the following claims.

Various technologies can be used to implement PLDs 140 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of configuring a programmable integrated circuit device with a user logic design, said method comprising:
   analyzing said user logic design to identify unidirectional logic paths within said user logic design and cyclic logic paths within said user logic design;
   assigning said cyclic logic paths to logic in a first portion of said programmable integrated circuit device that operates at a first data rate, and assigning said unidirectional logic paths to logic in a second portion of said programmable integrated circuit device that operates at a second data rate lower than said first data rate; and pipelining said unidirectional logic paths in said second portion of said programmable integrated circuit device to compensate for said lower second data rate.

2. The method of claim 1 wherein said analyzing comprises applying cycle detection to said user logic design.

3. The method of claim 2 further comprising:
determining criticality of each cycle; and
granting priority to cycles for assignment to said first portion of said programmable integrated circuit device according to said criticality.

4. The method of claim 2 wherein said assigning comprises configuring logic into said first portion and said second portion according to said cycle detection.

5. The method of claim 4 wherein said assigning is performed iteratively.

6. The method of claim 4 wherein said configuring comprises programming programmable supply voltages.

7. The method of claim 1 wherein said assigning takes into account subsequent availability of register retiming.

8. The method of claim 1 wherein said assigning comprises:
synthesizing said cyclic logic paths and said unidirectional logic paths to said logic in said first portion of said programmable integrated circuit device that operates at said first data rate; and
when said first portion of said programmable integrated circuit device is insufficient to contain all of said cyclic logic paths and said unidirectional logic paths, resynthesizing at least a portion of said unidirectional logic paths to said logic in said second portion of said programmable integrated circuit device that operates at said second data rate lower than said first data rate.

9. The method of claim 1 further comprising:
incorporating results of said analyzing, said assigning and said pipelining into a configuration for said programmable integrated circuit device; and
loading said configuration into memory of a programmable integrated circuit device.

10. A programmable integrated circuit device programmed with a user logic design, said programmed programmable integrated circuit device comprising:
a first portion of programmable logic resources operating at a first data rate and a second portion of said programmable logic resources operating at a second data rate lower than said first data rate; wherein:
cyclic logic paths in said user logic design are programmed in said first portion of said programmable logic resources;
unidirectional logic paths in said user logic design are programmed in said second portion of said programmable logic resources; and
said unidirectional logic paths in said second portion of said programmable logic resources are pipelined to compensate for said lower second data rate.

11. The programmed programmable integrated circuit device of claim 10 wherein:
each of said programmable logic resources is connected to a power supply having a programmably selectable drive voltage; and
each of said programmable logic resources in said first portion is programmably allocated to a first drive voltage, and each of said programmable logic resources in said second portion is programmably allocated to a second drive voltage, lower than said first drive voltage.

12. The programmed programmable integrated circuit device of claim 10 wherein:
each of said programmable logic resources has at least one of a transistor width, a threshold voltage, a gate length, a drive voltage, or a wire width;
each of said programmable logic resources in said first portion has at least one of:
a wider transistor width than any transistor width of any programmable logic resource in said second portion,
a lower threshold voltage than any threshold voltage of any programmable logic resource in said second portion,
a shorter gate length than any gate length of any programmable logic resource in said second portion,
a higher drive voltage than any drive voltage of any programmable logic resource in said second portion, or
a wider wire width than any wire width of any programmable logic resource in said second portion.

13. The programmed programmable integrated circuit device of claim 12 wherein:
said programmable logic resources in said first portion are located in a first region of said programmable integrated circuit device; and
said programmable logic resources in said second portion are located in a second region of said programmable integrated circuit device.

14. A non-transitory machine readable storage medium encoded with instructions for performing a method of configuring a programmable integrated circuit device with a user logic design, said instructions comprising:
instructions to analyze said user logic design to identify unidirectional logic paths within said user logic design and cyclic logic paths within said user logic design;
instructions to assign said cyclic logic paths to logic in a first portion of said programmable integrated circuit device that operates at a first data rate, and to assign said unidirectional logic paths to logic in a second portion of said programmable integrated circuit device that operates at a second data rate lower than said first data rate; and
instructions to pipeline said unidirectional logic paths in said second portion of said programmable integrated circuit device to compensate for said lower second data rate.

15. The non-transitory machine readable storage medium of claim 14 wherein said analyzing comprises applying cycle detection to said user logic design.

16. The non-transitory machine readable storage medium of claim 15 wherein said instructions further comprise:
instructions to determine criticality of each cycle; and
instructions to grant priority to cycles for assignment to said first portion of said programmable integrated circuit device according to said criticality.

17. The non-transitory machine readable storage medium of claim 15 wherein said instructions to assign comprise instructions to configure logic into said first portion and said second portion according to said cycle detection.

18. The non-transitory machine readable storage medium of claim 17 wherein said instructions to assign comprise instructions that are performed iteratively.

19. The non-transitory machine readable storage medium of claim 17 wherein said instructions to configure comprise instructions to program programmable supply voltages.

20. The non-transitory machine readable storage medium of claim 14 wherein said instructions to assign comprise instructions that take into account subsequent availability of register retiming.

21. The non-transitory machine readable storage medium of claim 14 wherein said instructions to assign comprise:
   instructions to synthesize said cyclic logic paths and said unidirectional logic paths to said logic in said first portion of said programmable integrated circuit device that operates at said first data rate; and
   instructions to, when said first portion of said programmable integrated circuit device is insufficient to contain all of said cyclic logic paths and said unidirectional logic paths, resynthesize at least a portion of said unidirectional logic paths to said logic in said second portion of said programmable integrated circuit device that operates at said second data rate lower than said first data rate.

22. The non-transitory machine readable storage medium of claim 14 wherein said instructions further comprise instructions to incorporate results of said analyzing, said assigning and said pipelining into a configuration for said programmable integrated circuit device.

\* \* \* \* \*